US008640965B2

(12) United States Patent
Sutera

(10) Patent No.: US 8,640,965 B2
(45) Date of Patent: Feb. 4, 2014

(54) DUAL-INTERFACE SMART CARD

(75) Inventor: Carl Mario Sutera, Meredith, NH (US)

(73) Assignee: American Bank Note Company, Columbia, TN (US)

( * ) Notice: Subject to any disclaimer, the term of this patent is extended or adjusted under 35 U.S.C. 154(b) by 0 days.

(21) Appl. No.: 13/362,090

(22) Filed: Jan. 31, 2012

(65) Prior Publication Data

US 2012/0193436 A1    Aug. 2, 2012

Related U.S. Application Data

(60) Provisional application No. 61/463,897, filed on Feb. 24, 2011, provisional application No. 61/462,238, filed on Jan. 31, 2011.

(51) Int. Cl.
| G06K 19/06 | (2006.01) |
| G06K 19/00 | (2006.01) |
| G06K 19/02 | (2006.01) |
| H01R 39/00 | (2006.01) |
| H01R 4/58 | (2006.01) |

(52) U.S. Cl.
USPC .............. 235/492; 235/487; 235/488; 439/1; 439/7; 439/22; 439/86

(58) Field of Classification Search
USPC .......... 235/492, 487, 488; 257/728, 734, 778; 343/718; 439/1, 7, 22, 86
See application file for complete search history.

(56) References Cited

U.S. PATENT DOCUMENTS

| 5,519,201 A | 5/1996 | Templeton, Jr. | |
| 5,671,525 A * | 9/1997 | Fidalgo | 29/600 |
| 6,049,976 A | 4/2000 | Khandros | |
| 6,142,381 A * | 11/2000 | Finn et al. | 235/492 |
| 6,170,880 B1 * | 1/2001 | Prancz | 283/86 |
| 6,186,398 B1 * | 2/2001 | Kato et al. | 235/449 |
| 6,612,556 B2 * | 9/2003 | Petrina | 267/168 |
| 7,607,583 B2 * | 10/2009 | Berardi et al. | 235/487 |
| 7,810,701 B2 * | 10/2010 | Nagano et al. | 228/112.1 |
| 2002/0053735 A1 * | 5/2002 | Neuhaus et al. | 257/728 |
| 2005/0040540 A1 * | 2/2005 | Haba et al. | 257/778 |
| 2005/0192068 A1 * | 9/2005 | Fenk | 455/575.7 |
| 2006/0038022 A1 * | 2/2006 | Reid et al. | 235/492 |
| 2007/0109208 A1 * | 5/2007 | Turner | 343/718 |
| 2007/0158816 A1 * | 7/2007 | Chow et al. | 257/690 |
| 2007/0272760 A1 | 11/2007 | Le Gouic | |
| 2008/0023711 A1 * | 1/2008 | Tarsa et al. | 257/98 |
| 2008/0283615 A1 | 11/2008 | Finn | |
| 2008/0308641 A1 * | 12/2008 | Finn | 235/492 |

* cited by examiner

*Primary Examiner* — Thien M Le
*Assistant Examiner* — Claude J Brown
(74) *Attorney, Agent, or Firm* — Kriegsman & Kriegsman

(57) ABSTRACT

A dual-interface smart card comprises an integrated circuit (IC) module coupled to a plastic card body. The IC module includes multiple downwardly facing, externally exposed contact pads that are electrically coupled to corresponding externally exposed sections of a radio frequency (RF) antenna incorporated into the card body. Each contact pad is electrically connected to the RF antenna by a pair of opposing, stapled-shaped, conductive elements, with one conductive element being permanently welded to the contact pad and the other permanently welded to the antenna. Each conductive element includes a pair of resilient spring arms that maintain electrical connection between the contact pad and the antenna even upon movement of the IC module relative to the card body. To provide further redundancy of connection between each contact pad and the antenna, the resilient spring arms of the opposing conductive elements are encapsulated with a supply of conductive filler material.

10 Claims, 8 Drawing Sheets

DUAL-INTERFACE SMART CARD

CROSS-REFERENCE TO RELATED APPLICATIONS

The present application claims the benefit of U.S. Provisional Patent Application Ser. No. 61/463,897, which was filed on Feb. 24, 2011 in the name of Carl Mario Sutera and U.S. Provisional Patent Application Ser. No. 61/462,238, which was filed on Jan. 31, 2011 in the name of Carl Mario Sutera, both disclosures being incorporated herein by reference.

BACKGROUND

The present invention relates generally to the plastic card manufacturing industry and, more specifically, to the manufacture of dual-interface smart cards.

Smart cards are well known devices that include a plastic card body into which is embedded an integrated circuit (IC). The integrated circuit is designed to store data that can be used, inter alia, to provide the card with electronic identification, authentication, data storage and application processing capabilities. As a result, smart cards are widely used in commerce to provide information and/or application processing capabilities in connection with, but not limited to, bank cards, credit cards, health insurance cards, driver's licenses, transportation cards, loyalty cards and membership cards.

The card body for a smart card is typically constructed out of one or more layers of any durable plastic material, such as polyvinyl chloride (PVC), acrylonitrile butadiene styrene (ABS) or polycarbonate. The dimensions of the card body are typically similar to the dimensions of a conventional credit card (i.e., 3.370 inches in length, 2.125 inches in width and 0.030 inches in thickness).

The integrated circuit (IC) is typically constructed as part of an integrated circuit (IC) module that includes a lead frame having a bottom surface on which the integrated circuit is fixedly mounted using a chip adhesive. The exposed portion of the IC is in turn encapsulated within a hard epoxy resin for protective purposes. As part of the smart card manufacturing process, the IC module is mounted, chip side down, into a fitted recess that is milled or otherwise formed into the top surface of the card body and is fixedly held in place using a hot melt adhesive.

Smart cards of the type as described above transmit data stored on the integrated circuit using either (i) a direct contact interface (the resultant products being commonly referred to in the art as contact smart cards), (ii) a contact-free interface (the resultant products being commonly referred to in the art as contactless smart cards) or (iii) a hybrid of the two aforementioned interfaces (the resultant products being commonly referred to in the art as dual-interface smart cards).

The contact interface for a dual-interface smart card is typically constructed as a plurality of gold-plated contact pads that are fixedly mounted onto the top surface of the lead frame and are arranged to form a total contact surface area of approximately 1 square centimeter. The underside of each contact pad is individually electrically connected to the integrated circuit by a corresponding gold-plated wire, the wires being encapsulated by a hard epoxy resin for protective purposes. As such, it is to be understood that the contact pads serve as an electrical interface for the IC when the smart card is inserted into an appropriate reader.

The contact-free interface for a dual-interface smart card is typically provided by a conductive antenna that is incorporated into the card body by any suitable means, such as through the use of embedding, etching, plating, printing or the like. Preferably, the antenna is arranged in a coiled, or spiraled, configuration around the IC module cavity and is, in turn, electrically connected to the integrated circuit, as will be described further in detail below. Accordingly, in response to an interrogation signal, information stored on the integrated circuit can be transmitted by the antenna as a radio frequency (RF) signal.

As noted above, the integrated circuit for a dual-interface smart card must be electrically connected to the antenna to effectively transmit data. Typically, a pair of opposing metal contact pads are mounted onto the underside of the lead frame, each contact pad being individually electrically connected to the integrated circuit by a corresponding gold-plated wire which is then encapsulated within a hard epoxy resin for protective purposes. The card body is then drilled, or routed, to the extent necessary so that the conductive component of the antenna is externally exposed at two separate locations.

Various techniques are known in the art for electrically connecting each contact pad formed on the underside of the IC module with a corresponding exposed portion of the antenna.

One such technique involves overfilling each routed hole with a conductive epoxy material that creates a convex protrusion or bump in direct alignment with each of the contact pads formed on the underside of the IC module. Accordingly, when the IC module is permanently affixed to the card body, an electrical connection is established between the integrated circuit and the antenna through the conductive epoxy.

The above-described method for electrically connecting the IC module to the antenna has been found in the industry to be largely unsatisfactory. Specifically, the conductive epoxy has been found to fragment, crack or otherwise break at one or both of its connection points in response to torsion or stress applied to the smart card during use and/or testing. As a result of the electrical disconnection of the IC module from the antenna, the smart card loses its RF signal transmission capabilities, which is highly undesirable.

In response, a number of alternative approaches for electrically connecting the IC module to the antenna have been implemented in the smart card manufacturing industry. However, these alternative approaches have been found to similarly suffer from a number of notable shortcomings including: (i) being considerably labor-intensive and time-consuming in nature, (ii) requiring the purchase of additional manufacturing equipment, and/or (iii) utilizing glues with limited shelf time.

Accordingly, it is an object of the present invention to provide a relatively inexpensive smart card that is flexible enough to support some stress but, at the same time, has the requisite structural integrity to maintain a strong physical connection of the IC module to the antenna.

SUMMARY OF THE INVENTION

It is an object of the present invention to provide a new and improved dual-interface smart card.

It is another object of the present invention to provide a new and improved dual-interface smart card that is durable in nature and designed to maintain the requisite internal electrical connectivity between components in response to torsion and stress applied thereto.

It is yet another object of the present invention to provide a dual-interface smart card that has a limited number of parts and is cost-effective to manufacture.

Accordingly, as a feature of the present invention, there is provided a smart card, the smart card comprising (a) a card body, the card body comprising an antenna, (b) an integrated circuit (IC) module coupled to the card body, the IC module comprising an IC chip and a contact pad electrically coupled to the IC chip, and (c) a first conductive element for electrically coupling the IC module to the antenna, the first conductive element being permanently conductively coupled to one of the antenna and the contact pad, the first conductive element comprising a first resilient contact member that is adapted to electrically contact the other of the antenna and the contact pad, the first resilient contact member being adapted to flex to the extent necessary to maintain electrical contact with the other of the antenna and the contact pad upon movement of the IC module relative to the card body.

Additional objects, as well as features and advantages, of the present invention will be set forth in part in the description which follows, and in part will be obvious from the description or may be learned by practice of the invention. In the description, reference is made to the accompanying drawings which form a part thereof and in which is shown by way of illustration various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate various embodiments of the invention and, together with the description, serve to explain the principles of the invention. In the drawings, wherein like reference numerals represent like parts.

DETAILED DESCRIPTION OF PREFERRED EMBODIMENTS

Figure 1:
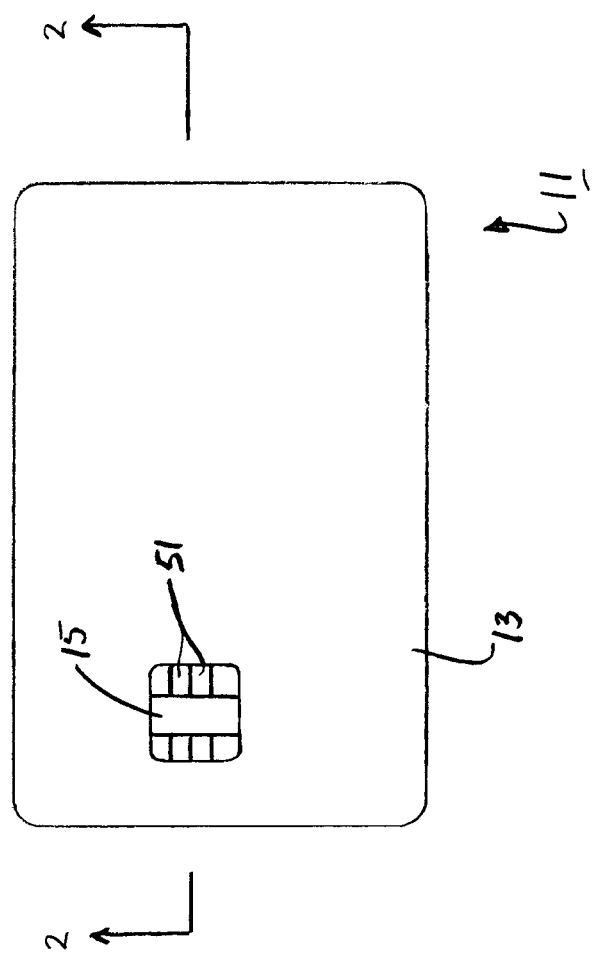
FIG. 1 is a top plan view of a first embodiment of a dual-interface smart card constructed according to the teachings of the present invention.
Figure 2:
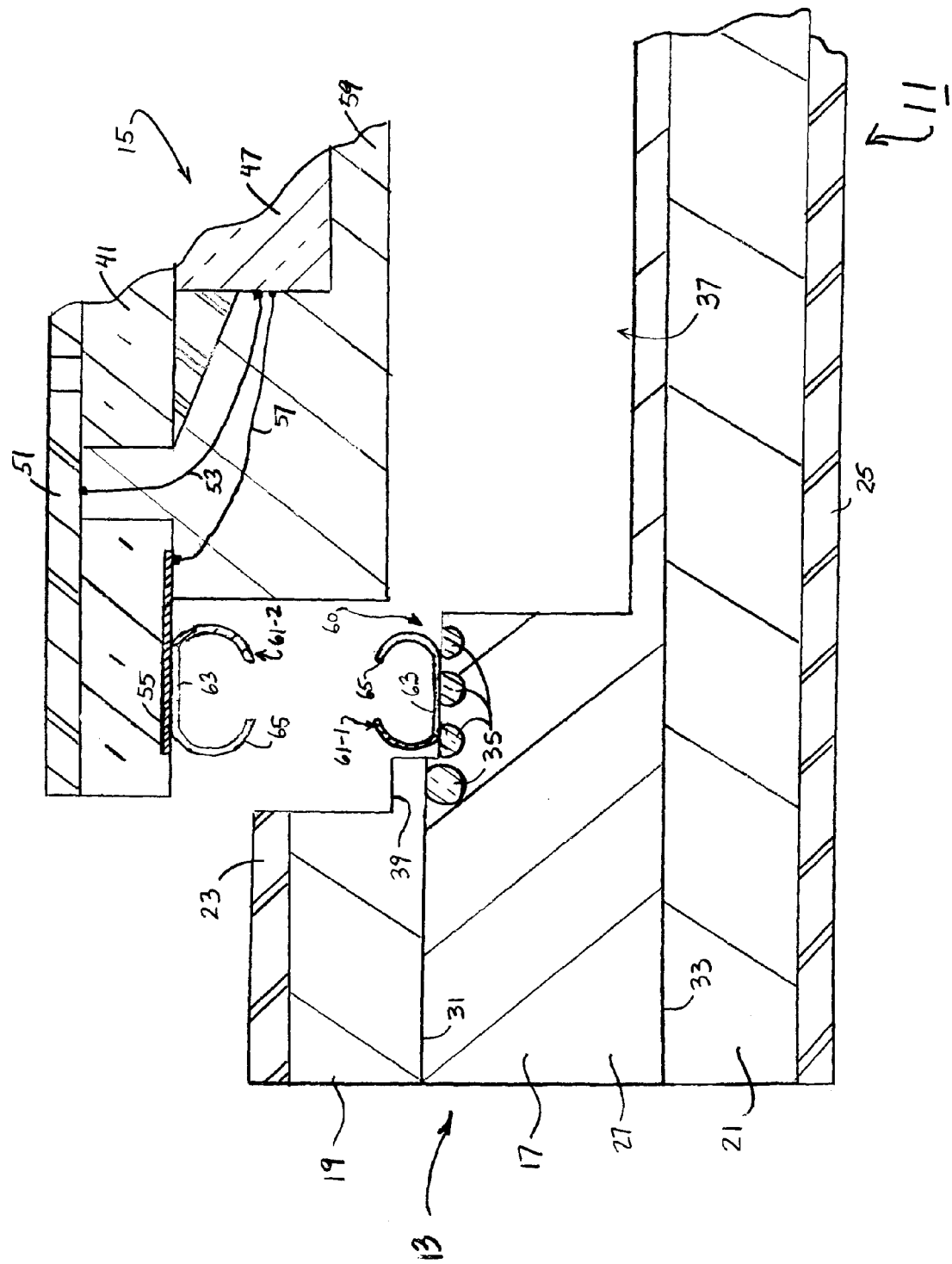
FIG. 2 is an enlarged, exploded, fragmentary, cross-section view of the dual-interface smart card shown in FIG. 1.

Referring now to FIGS. 1 and 2, there are shown top plan and exploded, fragmentary, cross-section views of a first embodiment of a dual-interface smart card constructed according to the teachings of the present invention, the first embodiment dual-interface smart card being identified generally by reference numeral 11. As will be described further below, smart card 11 is capable of transmitting stored electronic data using either a direct contact interface or a contact-free interface.

Dual-interface smart card 11 comprises a plastic card body 13 and an integrated circuit (IC) module 15 fixedly mounted into card body 13, as will be described further below.

Figure 3:
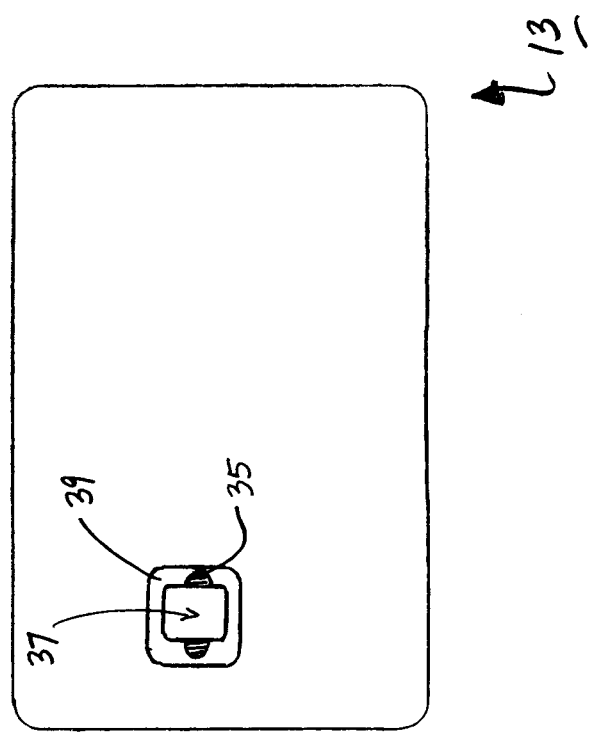
FIG. 3 is a top view of the card body shown in FIG. 1, the card body being shown without its pair of conductive connectors for simplicity purposes only.

As seen most clearly in FIGS. 2 and 3, card body 13 is constructed out of a plurality of layers of any durable plastic material, such as polyvinyl chloride (PVC), acrylonitrile butadiene styrene (ABS) or polycarbonate. The dimensions of card body 13 are preferably similar to the dimensions of a conventional credit card (i.e., 3.370 inches in length, 2.125 inches in width and 0.030 inches in thickness).

Card body 13 comprises a radio frequency (RF) inlay 17 that is disposed between a top print layer 19 and a bottom print layer 21. In addition, a pair of opposing transparent overlays 23 and 25 is disposed on the top and bottom surfaces, respectively, of the stack. It should be noted that layers 17, 19, 21, 23 and 25 are then permanently joined together by any conventional means, such as through a lamination process, to form the unitary card body 13.

It should be noted that card body 13 is not limited to the number and arrangement of layers as described herein. Rather, it is to be understood that the number, construction and dimensions of the individual layers could be modified without departing from the spirit of the present invention as long as the overall dimensions of card body 13 remain generally the same (i.e., 3.370 inches in length, 2.125 inches in width and 0.030 inches in thickness).

RF inlay 17 includes a core layer 27 that is preferably constructed of a polyvinyl chloride (PVC) material that is approximately 350 µm in thickness, core layer 27 comprising a substantially flat top surface 31 and a substantially flat bottom surface 33. As seen most clearly in FIG. 2, a radio frequency antenna 35 is incorporated into core layer 27. Specifically, RF antenna 35 is preferably in the form of a 100 µm diameter copper wire that is embedded into top surface 31 and arranged in a coiled, or spiraled, configuration around the periphery of core layer 27, the copper wire preferably being wrapped within an insulated sheath, or jacket (not shown). As will be described further in detail below, antenna 35 is electrically connected to IC module 15 to provide smart card 11 with RF transmission capabilities in the frequency range of approximately 13.56 MHz.

Each of top and bottom print layers 19 and 21 is preferably constructed out of a 200 µm thick white PVC material. As can be appreciated, layers 19 and 21 are adapted to receive printed matter to identify and decorate card 11.

In addition, each of top and bottom overlays 23 and 25 is preferably constructed out of a 50 µm thick transparent PVC material. As can be appreciated, overlays 23 and 25 are designed to protect card body 13 from common environmental conditions.

As seen in both FIGS. 2 and 3, card body 13 is shaped to define a generally rectangular module cavity, or recess, 37 that is dimensioned to fittingly receive module 13 (i.e., the cavity being approximately 13.4 mm in length by approximately 12.3 mm in width). Cavity 37 is formed into card body 13 by any conventional means, such as through a milling process, and extends down from the top surface of top print layer 19 to a depth that is nearly the entire thickness of core layer 27. A narrow shelf, or mounting surface, 39 is formed into top print layer 19 around the periphery of cavity 37 in order to support IC module 15, as will be described further below.

Figure 4:
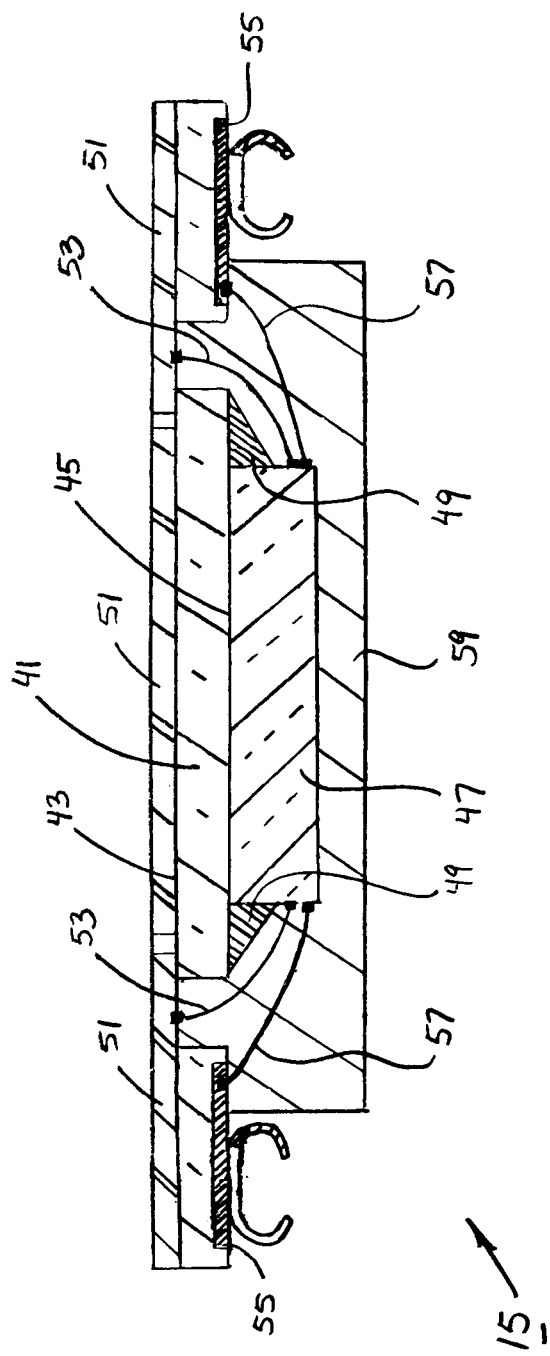
FIG. 4 is a section view of the IC module shown in FIG. 2.

Referring now to FIG. 4, IC module 15 comprises a lead frame 41 that includes a top surface 43 and a bottom surface 45. An integrated circuit chip 47 is in turn fixedly secured onto bottom surface 45 of lead frame 41 by a chip adhesive 49.

A plurality of gold-plated contact pads 51 are fixedly mounted onto top surface 43 of lead frame 41 and are arranged to form a total contact surface area of approximately 1 sq cm. It should be noted that the underside of each contact pad 51 is electrically connected to IC chip 47 by a corresponding gold-plated wire 53, thereby enabling a corresponding reader (not shown) to retrieve electronic data from IC chip 47 through contact pads 51.

In addition, a pair of gold-plated contact pads 55 is fixedly mounted onto bottom surface 45 of lead frame 41 at opposite ends, each contact pad 55 being electrically connected to IC chip 47 by a corresponding gold-plated wire 57. An encapsulation material 59, such as a hard epoxy resin, is deposited over IC chip 47 as well as wires 53 and 57 to protect the sensitive components and ensure that adequate connectivity is maintained.

Referring back to FIG. 2, a pair of bores 60 (only one of which is shown in FIG. 2) is routed, or drilled, down into shelf 39. As can be seen, each bore 60 is drilled a depth that is sufficient to expose a segment of the copper wire antenna 35 and a gap region that is approximately 213 um. As will be described in detail below, the exposed portion of antenna 35 is conductively coupled to each of contact pads 55, thereby providing IC module 15 with RF transmission capabilities. Although not shown herein, it is to be understood that a conductive contact pad could be mounted onto the exposed segments of antenna 35 to facilitate connection therewith.

Preferably, smart card 11 is assembled in the following manner. Specifically, card body 13 is preferably formed from the plurality of laminates as described in detail above. In turn, card body 13 is shaped to define module cavity 37 by any conventional means, such as through a milling process. Furthermore, the pair of bores 60 is routed, or drilled, down into shelf 39 at a depth that is sufficient to expose a segment of the strands of copper wire antenna 35.

IC module 15 is then mounted, chip 47 side down, onto shelf 39 with each contact pad 55 on the underside of lead frame 41 disposed in direct alignment with a corresponding exposed segment of RF antenna 35, as shown in FIG. 2. Preferably, a hot melt (not shown) is utilized to permanently join IC module 15 to card body 13 to yield the unitary card 11.

As a principal feature of the present invention, smart card 11 relies upon a novel means for connecting bottom contact pads 55 with the exposed segments of RF antenna 35, the details of the connection means to be described in detail below. It is to be understood that the novel connection means provides smart card 11 with enough flexibility to support bending stress without compromising the requisite structural integrity of the internal physical connections, which is an object of the present invention.

Specifically, referring now to FIG. 2, the novel connection means utilizes first and second opposing conductive elements, or connectors, 61-1 and 61-2 as well as a supply of conductive filler material 62 (shown in dashed form in FIG. 6) that encapsulates at least a portion of elements 61. For purposes of simplicity only, a single pair of conductive elements 61 is shown joining one contact pad 55 to exposed segments of RF antenna 35. However, it is to be understood that an identical pair of conductive elements 61 and filler material 62 is preferably used to similarly join the other contact pad 55 to exposed segments of RF antenna 35 at a separate location.

Figure 5:
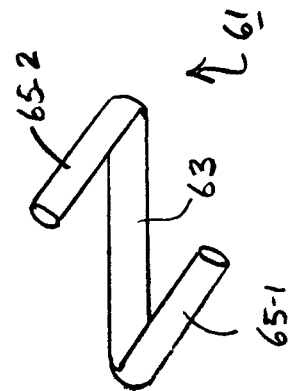
FIGS. 5(a) and 5(b) are front and top views, respectively, of one of the conductive connectors shown in FIG. 2.
Figure 5:
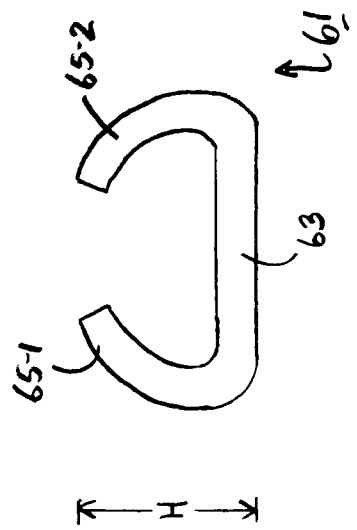

As seen most clearly in FIGS. 5(a) and 5(b), each conductive element 61 is preferably constructed out a length of thin wire (e.g., 100 micron in diameter) that is formed from a highly conductive material, such as gold, copper or aluminum. Although conductive element 61 is represented herein as wire that is generally circular in transverse cross-section, it is to be understood that alternate types of conductive elements (e.g., flattened, ribbon-type conductive elements) could be used in place thereof without departing from the spirit of the present invention.

Figure 6:
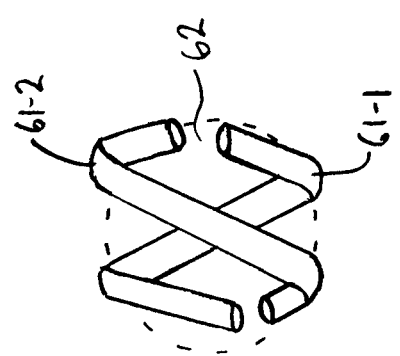
FIG. 6 is a top view of the pair of conductive connectors shown in FIG. 2, the pair of conductive connectors being shown disposed together in a nested configuration, the pair of conductive connectors being shown with a supply of conductive silicone disposed therebetween, the supply of conductive silicone being represented in dashed form for ease of illustration.

Each conductive element 61 has a generally U-shaped, staple-like configuration with a straightened base portion, or support, 63 and a pair of resilient spring arms, or flexible contact members, 65-1 and 65-2 formed at opposite ends of base portion 63. Spring arms 65 curve inward towards one another, as seen most clearly in FIG. 5(a). However, it should be noted that spring arms 65 extend laterally outward in opposing directions, as seen most clearly in FIG. 5(b), so as to provide conductive element 61 with a somewhat spiral, or helical, overall configuration. As can be appreciated, the outward lateral orientation of spring arms 65 serves to, inter alia, (i) expose base portion 63 as a region for conductive contact and (ii) prevent interference between spring arms 65 when a pair of conductive elements 61 is nested tightly together, as shown in FIG. 6.

It is to be understood that curvature of each spring arm 65 allows for its flexion downward upon receiving a suitable compressive force thereon, with each spring arm 65 resiliently returning to its original configuration upon withdrawal of such a compressive force. In this capacity, the resilient, spring-biased nature of each arm 65 enables each conductive element 61 to maintain direct contact with a complementary conductive item (e.g., antenna 35, pad 55 and/or opposing element 61) even when compression and separation forces are applied thereto. Because it has been found that the IC module in a conventional smart card is prone to movement relative to its card body, the utilization of spring-like contact arms 65 herein to maintain direct physical contact between IC module 15 and antenna 35 over time (i.e., even upon repeated movement of IC module 15 relative to card body 13) serves as an important feature of the present invention.

It should be noted that each conductive element 61 is not limited to the slightly spiraled, staple-like configuration as represented herein. Rather, it is to be understood that each conductive element 61 could be alternatively configured without departing from the spirit of the present invention. However, it is preferred that modified versions of conductive elements 61 similarly utilize contact members with resilient characteristics. For example, rather than an arcuate design, each arm 65 could have an alternative configuration that enables direct electrical contact to be maintained between contact pad 55 and antenna 35 even upon slight movement of IC module 15 relative to card body 13, such as a resilient coil, loop, tube, piston, sphere or the like, without departing from the spirit of the present invention.

It should also be noted that each conductive element 61 is represented herein as comprising two spring arms 65 to create redundancy in its points of physical connection. Accordingly, if one spring arm 65 should become disconnected from its opposing conductive item, it is to be understood that the direct contact established with the conductive element 61 can be adequately retained through its other arm 65, which is highly desirable.

However, it should be noted that each conductive element 61 is not limited to a dual-arm construction. Rather, it is to be understood that the number of spring arms 65 for each conductive element 61 could be increased or decreased without departing from the spirit of the present invention. For example, each conductive element 61 could be alternatively include additional spring arms in order to increase the total number of connection points and overall contact surface area, thereby improving the reliability of the connection over time, which is highly desirable.

Referring back to FIG. 2, base portion 63 of first conductive element 61-1 is permanently welded to one or more strands of exposed RF antenna 35 by any conventional means, such as ultrasonic welding, with its opposing spring arms 65 directed upwards for electrical contact with contact pad 55 through either (i) direct contact with contact pad 55 and/or (ii) direct contact with second conductive element 61-2 (thereby resulting in the indirect contact with contact pad 55). It should be noted that each spring arm 65 for first conductive element 61-1 preferably has a height H that is greater than the depth of routed bore 60, thereby enabling each spring arm 65 to extend beyond shelf 39 and into direct conductive contact against opposing conductive element 61-2 and/or contact pad 55 when smart card 11 is in its fully assembled form, which is highly desirable.

Similarly, base portion 63 of second conductive element 61-2 is permanently welded to contact pad 55 by any conventional means, such as ultrasonic welding, with its opposing spring arms 65 directed downward towards for electrical contact with one or more strands of exposed RF antenna 35 through either (i) direct contact with antenna 35 and/or (ii) direct contact with first conductive element 61-1 (thereby resulting in the indirect contact with antenna 35). Preferably, each spring arm 65 for second conductive element 61-2 similarly has a height H that is greater than the depth of routed bore 60, thereby enabling each spring arm 65 to extend down into direct conductive contact against opposing conductive element 61-1 and/or one or more strands of exposed RF antenna 35 when smart card 11 is in its fully assembled form, which is highly desirable.

Preferably, conductive elements 61-1 and 61-2 are oriented in an offset relationship so that spring arms 65 do not interfere with one another as base portions 63 are drawn towards one another. As a result, conductive elements 61-1 and 61-2 can nest, or crash, tightly together, as shown in FIG. 6, with each spring arm 65 drawn firmly against one or more complementary conductive items (e.g., antenna 35, pad 55 and/or a portion of an opposing conductive element 61).

In addition, a supply of conductive filler material 62 is deposited into routed bore 60 so as to encapsulate at least a portion of spring arms 65 of first and second conductive element 61-1 and 61-2. Filler material 62 is preferably constructed of a low durometer conductive silicone that is approximately 5 um in thickness. Due to its inherent softness, it is to be understood that conductive filler material 62 is able to receive substantial torsion forces without experiencing degradation of its physical structure (i.e., without cracking, fragmenting, breaking or the like). As a result, by permanently welding each conductive element 61 at one end and, in turn, encapsulating its opposite end with soft filler material 62, it is to be understood that a strong connective bond is established between IC module 15 and RF antenna 35 that is able to withstand considerable torsion forces, which is highly desirable. In addition to its conductive properties, filler material 62 protects conductive elements 61-1 and 61-2 from oxidation and other forms of contamination that can jeopardize conductivity.

It should be noted that filler material 62 is not limited to a low durometer conductive silicone. Rather, it is to be understood that filler material 62 could be formed from any conventional conductive material with considerable softness and flexibility that enables it to withstand stress (e.g., mercury) without departing from the spirit of the present invention.

As a principal feature of the present invention, connective redundancy is utilized to conductively couple IC module 15 to antenna 35. Specifically, each contact pad 55 is conductively coupled to one or more exposed strands of antenna 35 using both (i) the direct physical contact of each spring arm 65 against one or more complementary conductive items (e.g., antenna 35, pad 55 and/or a portion of an opposing conductive element 61) and (ii) conductive filler material 62 to encapsulate at least a portion of opposing conductive elements 61. Stated another way, even when IC module 15 experiences significant motion relative to card body 13, electrical connection is adequately maintained between IC module 15 and RF antenna 35 through either direct, physical, metal-on-metal spring contact and/or the use of conductive filler material 62. As a result of the aforementioned connective redundancy, smart card 11 is rendered less susceptible to failure than traditional smart cards that rely upon a single means of electrically connecting an IC module to an RF antenna.

It should be noted that the details relating to the construction of smart card 11 are intended to be merely exemplary. Accordingly, it is to be understood that those skilled in the art shall be able to make numerous variations and modifications to smart card 11 without departing from the spirit of the present invention. All such variations and modifications are intended to be within the scope of the present invention as defined in the appended claims.

Figure 7:
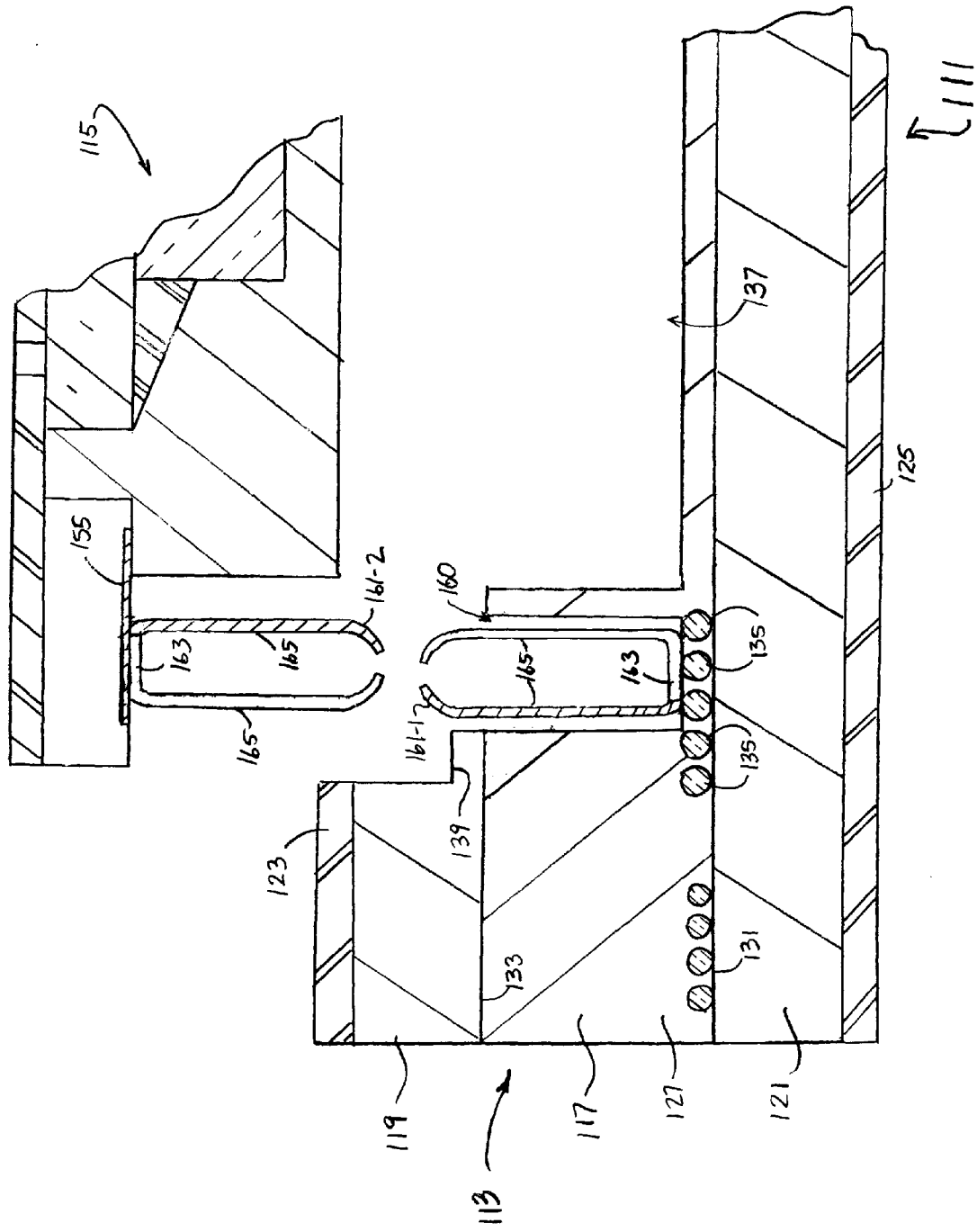
FIG. 7 is an enlarged, exploded, fragmentary cross-section view of a second embodiment of a dual-interface smart card constructed according to the teachings of the present invention.

For example, referring now to FIG. 7, there is shown an exploded, fragmentary, cross-section view of a second embodiment of a dual-interface smart card constructed according to the teachings of the present invention, the second embodiment dual-interface smart card being identified generally by reference numeral 111. As will be described further below, smart card 111 is capable of transmitting stored electronic data using either a direct contact interface or a contact-free interface.

As can be seen, smart card 111 is similar to smart card 11 in that smart card 111 comprises a plastic card body 113 that is shaped to define a module cavity, or recess, that is dimensioned to receive an integrated circuit (IC) module 115.

Plastic card body 113 is similar to plastic card body 13 in that plastic card body 113 comprises a radio frequency (RF) inlay 117 that is disposed between a top print layer 119 and a bottom print layer 121. In addition, a pair of opposing transparent overlays 123 and 125 is disposed on the top and bottom surfaces, respectively, of the stack. To form the unitary card body 113, layers 117, 119, 121, 123 and 125 are then permanently joined together by any conventional means, such as through a lamination process.

The principal distinction between plastic card body 113 and plastic card body 13 relates to the orientation of its associated RF inlay. Specifically, card body 13 is formed with RF inlay 17 disposed in its natural orientation (i.e., with flat top surface 31 facing upward). By comparison, card body 113 is formed with RF inlay 117 flipped upside down, or inverted, (i.e., with its flat top surface 131 facing downward and its flat bottom surface 133 facing upward). Accordingly, radio frequency antenna 135, which is still preferably in the form of a 100 μm diameter copper wire, is effectively positioned along the underside of core layer 127 (i.e., adjacent bottom print layer 121).

Figure 8:
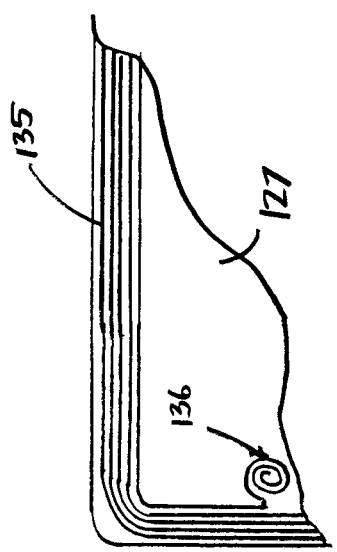
FIG. 8 is a fragmentary, bottom view of the RF inlay shown in FIG. 7.

As seen most clearly in FIG. 8, RF antenna 135 is arranged as a plurality of concentric strands that extend along the periphery of core layer 127. Preferably, one strand of antenna 135 is arranged in a dense configuration, such as a tightly wrapped coil, spiral or zig zag formation, to yield a contact terminal 136 that is aligned directly beneath a corresponding contact pad 155 in IC module 115. In addition, although not shown herein, a conductive contact pad may be directly welded onto contact terminal 136 to further facilitate electrical connection. It should be noted that the dense configuration of contact terminal 136 ensures that when each of the pair of bores 160 (only one of which is shown in FIG. 7) is routed, or drilled, down into shelf 139, a segment of the copper wire antenna is rendered exposed for contact.

Referring back to FIG. 7, smart card 111 is similar to smart card 11 in that smart card utilizes first and second opposing conductive elements 161-1 and 161-2 as well as a supply of conductive filler material (not shown) to encapsulate elements 161. Specifically, each conductive element 161 is preferably constructed out a length of thin wire that is formed from a highly conductive material, such as gold or aluminum, and configured as a U-shaped staple with a generally straight base portion 163 and a pair of opposing, inwardly curved spring arms 165.

Accordingly, the base portion 163 of first conductive element 161-1 is permanently welded to one or more strands of exposed RF antenna 135 with its spring arms 165 protruding in the upward direction towards contact pad 155. Preferably, each spring arm 165 for conductive element 161-1 is of a length greater than the depth of routed bore 160 to promote contact with contact pad 155 and/or second conductive element 161-2 when smart card 11 is in its fully assembled form.

Similarly, base portion 163 of second conductive element 161-2 is permanently welded to contact pad 155 with its spring arms 165 protruding in the downward direction towards the one or more strands of exposed RF antenna 135. Preferably, each spring arm 165 for second conductive element 161-2 is of a length greater than the depth of routed bore 160 to promote contact with exposed strands of RF antenna 135 and/or first conductive element 161-1 when smart card 11 is in its fully assembled form.

As noted briefly above, a supply of conductive filler material, which is preferably constructed of a low durometer silicone, is deposited into routed bore 160 so as to encapsulate the majority of the length of arms 165 for first and second conductive elements 161-1 and 161-2. In this manner, the filler material serves to conductively couple first and second conductive elements 161-1 and 161-2, thereby providing redundant electrical connection between IC module 115 and RF antenna 135, which is a principal object of the present invention.

It should be noted that by inverting RF inlay 117, the depth of routed bore 160 is lengthened considerably. As a result, the length, or area, of contact between first and second conductive elements 161-1 and 161-2 is substantially increased. Accordingly, by extending the area of contact between elements 161, it is to be understood that a more robust, reliable and secure connection is established between IC module 115 and RF antenna 135, which is highly desirable.

What is claimed is:

1. A smart card, comprising:
   (a) a card body, the card body comprising an antenna,
   (b) an integrated circuit (IC) module coupled to the card body, the IC module comprising an IC chip and a contact pad electrically coupled to the IC chip,
   (c) a first conductive element for electrically coupling the IC module to the antenna, the first conductive element comprising,
      (i) a base portion conductively connected onto the antenna, and
      (ii) a plurality of resilient contact members extending from the base portion,
   (d) a second conductive element for electrically coupling the IC module to the antenna, the second conductive element being separate from the first conductive element, the second conductive element comprising,
      (i) a base portion conductively connected onto the contact pad, and
      (ii) a plurality of resilient contact members extending from the base portion,
   (e) wherein, with the smart card in its assembled form, the first and second conductive elements directly oppose each other and engage one another through a plurality of direct contact points.

2. The smart card as claimed in claim 1 wherein the first resilient contact member for the first conductive element directly contacts the contact pad.

3. The smart card as claimed in claim 1 wherein the first resilient contact member for the first conductive element indirectly contacts the contact pad.

4. The smart card as claimed in claim 1 further comprising a supply of conductive filler material that encapsulates the plurality of direct contact points between the first and second conductive elements.

5. The smart card as claimed in claim 4 wherein the supply of conductive filler material is in the form of a conductive silicone.

6. The smart card as claimed in claim 1 wherein the card body is shaped to define a module cavity that is dimensioned to receive at least a portion of the IC module.

7. The smart card as claimed in claim 6 wherein the card body comprises a plurality of plastic layers that are permanently joined together to form a unitary member.

8. The smart card as claimed in claim 7 wherein the card body includes a radio frequency (RF) inlay, the RF inlay comprising a core layer to which the antenna is coupled.

9. The smart card as claimed in claim 8 wherein the card body further comprises:
   (a) top and bottom transparent overlays, the RF inlay being disposed between the top and bottom transparent overlays,
   (b) a top print layer disposed between the top overlay and the RF inlay, and
   (c) a bottom print layer disposed between the bottom overlay and the RF inlay.

10. The smart card as claimed in claim 1 wherein the IC module additionally comprises:
   (a) a lead frame having a top surface and a bottom surface, the IC chip being mounted onto the bottom surface of the lead frame, and
   (b) at least one externally exposed contact pad mounted onto the top surface of the lead frame, the at least one externally exposed contact pad being electrically coupled to the IC chip.

* * * * *